United States Patent
Hwang et al.

(10) Patent No.: US 6,995,931 B2
(45) Date of Patent: Feb. 7, 2006

(54) TEMPERATURE CONTROLLED OPTOELECTRONIC DEVICE

(75) Inventors: In-duk Hwang, Suwon-si (KR); Gil-won Yoon, Seoul (KR); Kye-jin Jeon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 8 days.

(21) Appl. No.: 10/831,121

(22) Filed: Apr. 26, 2004

(65) Prior Publication Data

US 2004/0264009 A1 Dec. 30, 2004

(30) Foreign Application Priority Data

Jun. 26, 2003 (KR) .................... 10-2003-0042130

(51) Int. Cl.
*G02B 7/02* (2006.01)
(52) U.S. Cl. ........................................ 359/820; 62/3.2
(58) Field of Classification Search ................ 359/819, 359/820; 62/3.2, 3.7, 259.2
See application file for complete search history.

(56) References Cited

U.S. PATENT DOCUMENTS

| | | | |
|---|---|---|---|
| 4,611,124 A | * | 9/1986 | Schneider ................ 250/208.1 |
| 5,041,727 A | | 8/1991 | Kojima et al. |
| 5,704,212 A | * | 1/1998 | Erler et al. .................... 62/3.2 |
| 5,918,469 A | | 7/1999 | Cardella |
| 6,230,497 B1 | | 5/2001 | Morris et al. |
| 6,509,520 B1 | | 1/2003 | Kyle et al. |
| 2002/0121094 A1 | * | 9/2002 | VanHoudt ..................... 62/3.3 |
| 2005/0117231 A1 | * | 6/2005 | Ueki et al. .................. 359/820 |

FOREIGN PATENT DOCUMENTS

| KR | 10-1997-0059716 | 8/1997 |
|---|---|---|
| KR | 10-2002-0035961 | 5/2002 |

* cited by examiner

*Primary Examiner*—Ricky Mack
(74) *Attorney, Agent, or Firm*—Lee & Morse, P.C.

(57) ABSTRACT

A temperature controlled optoelectronic device includes an optoelectronic transducer having an active area, an electronic cooling device, on which the optoelectronic transducer is mounted, and a temperature sensor installed in the electronic cooling device. The temperature sensor and the electronic cooling device control a temperature of the optoelectronic transducer. A surface of an electronic cooling device directly contacts a base of the optoelectronic transducer for efficient thermal coupling. When the temperature sensor for monitoring the temperature of the optoelectronic transducer is directly attached to a substrate of the electronic cooling device, e.g., to an inside surface of a plate on which the optoelectronic transducer is mounted, the temperature of the optoelectronic transducer can be accurately sensed and adjusted to a precise target temperature.

20 Claims, 4 Drawing Sheets

TEMPERATURE CONTROLLED OPTOELECTRONIC DEVICE

BACKGROUND OF THE INVENTION

1. Field of the Invention

The present invention is directed to an optoelectronic device including an optoelectronic transducer and a cooling device for accurately controlling the temperature of the optoelectronic transducer.

2. Description of the Related Art

Optoelectronic devices, such as detectors and light sources, are very sensitive to temperature. The response sensitivity or wavelength output for optoelectronic devices can vary even with a slight change in temperature. Hence, accurate signal detection/generation can be achieved only with highly precise control of the temperature of optoelectronic devices.

Non-cooled transistor outline (TO) can optoelectronic device packages do not include electronic cooling modules for temperature control. Instead, TO-can optoelectronic device packages adopt an indirect cooling system by installing a separate cooling unit outside the TO-can package. Accordingly, non-cooled TO-can optoelectronic device packages do not completely contact the surface of the cooling unit. Thus, heat output by the optoelectronic device cannot be properly thermally coupled to the cooling unit. Also, in TO-can optoelectronic device packages, a temperature-sensing probe is indirectly fixed to a heat transmission block. Thus, the probe cannot accurately sense the temperature of the TO-can optoelectronic device packages.

There are many situations in which inaccurate control of the temperature of an optoelectronic device adversely affects performance. For example, to measure the concentration of glucose in human blood, light sources outputting light in a specific wavelength band, including a first wavelength band at which glucose has a high absorption and a second wavelength band at which glucose has a low absorption, is needed. After illumination of a part of a human body with the specific wavelength band, a TO-can optoelectronic device package, typically an infrared (IR) sensor, measures light reflected or transmitted by the part of the human body. The glucose concentration is calculated by statistically analyzing a difference between the amount of light absorbed in the first and second wavelength bands.

However, the absorption spectrum shifts very slightly with a change in the glucose concentration. Accordingly, a change in the absorption spectrum arising from a change in the temperature of the sensor must be less than that arising from a change in the glucose concentration. As a result, the temperature of the sensor must be precisely maintained at a target temperature.

To realize this temperature control, a spectrophotometer for performing such glucose measurement may include a closed housing in which a temperature sensing element is disposed near an IR TO-can sensor. Accordingly, this necessitates an additional closed housing element. Further, in the spectrophotometer, an electronic cooling module is disposed underneath the sensor. As a result, the state of thermal coupling of the electronic cooling module to the TO-can sensor is improved. However, because a sensor probe for monitoring the temperature of the TO-can sensor is disposed directly on the electronic cooling module, e.g., on the same surface on which the TO-can sensor is mounted, the temperature of the TO-can sensor cannot be accurately detected.

SUMMARY OF THE INVENTION

The present invention is therefore directed to a temperature controlled optoelectronic device which substantially overcomes one or more of the problems due to the limitations and disadvantages of the related art.

It is a feature of the present invention to provide an optoelectronic device which efficiently couples heat away from an optoelectronic transducer. It is another feature of the present invention to provide accurate sensing of the temperature of the optoelectronic transducer.

At least one of the above and other features and advantages of the present invention may be realized by providing an optoelectronic device, including an optoelectronic transducer having an active area, an electronic cooling device, on which the optoelectronic transducer is mounted, and a temperature sensor installed in the electronic cooling device. The temperature sensor and the electronic cooling device control a temperature of the optoelectronic transducer.

The optoelectronic transducer may include a head having the active area, a base, which supports the head, and a plurality of leads, which are electrically coupled to the active area and extend from the base. The electronic cooling device may include a first plate at a heat-absorption side of the electronic cooling device on which the optoelectronic transducer is mounted, e.g., beneath the head, a second plate at a heat-emission side of the electronic cooling device, the second plate being at a predetermined distance from the first plate, and a plurality of thermoelectric cooling elements arranged between the first and second plates.

The temperature sensor may be attached to a bottom surface of the first plate. Wiring layers for electrically connecting the thermoelectric cooling elements to one another may be formed on the bottom surface of the first plate. The temperature sensor may be directly connected to the wiring layers.

The optoelectronic device may include a bracket protecting the optoelectronic transducer and the electronic cooling device. The bracket may include an opening exposing the active area. The bracket may include a body through which the active area is exposed and a flange formed around the body. The flange may include at least one through hole for securing the optoelectronic device to a fixture, e.g., a heat sink. The bracket may be made of an adiabatic material and/or a material having a high thermal resistance.

The optoelectronic transducer may be a detector. The optoelectronic transducer may be a TO-can transducer. The optoelectronic transducer may include leads electrically coupled to the active area and the electronic cooling device may include holes therein for the leads.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
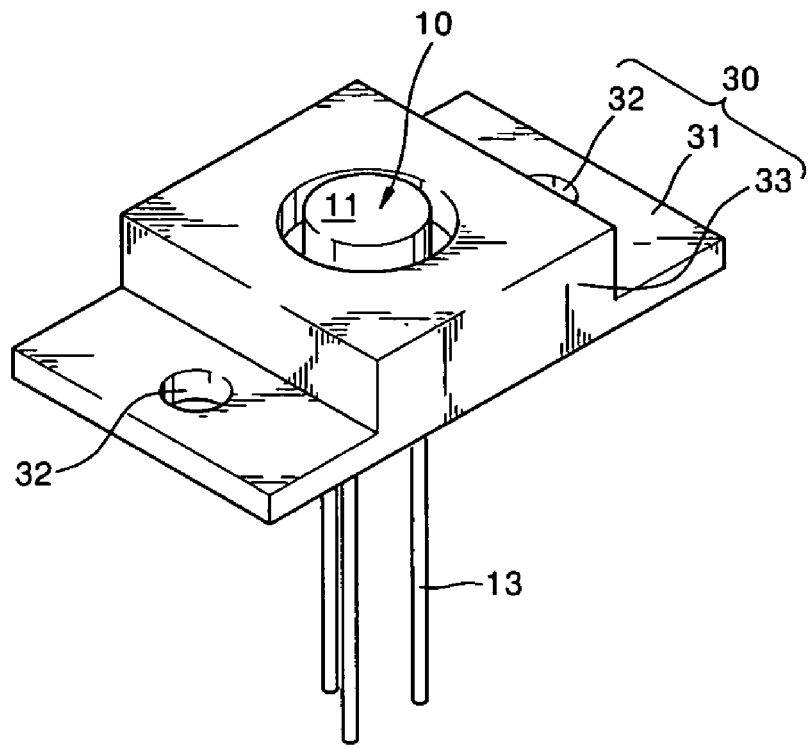
FIG. 1 illustrates a perspective view of an optoelectronic device according to an exemplary embodiment of the present invention.

Korean Application No. 2003-42130, filed Jun. 26, 2003, in the Korean Intellectual Property Office, and entitled: "Opto-Electronic Signal Detector," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the concept of the invention to those skilled in the art. In the drawings, the thickness of layers and regions are exaggerated for clarity.

Figure 2:
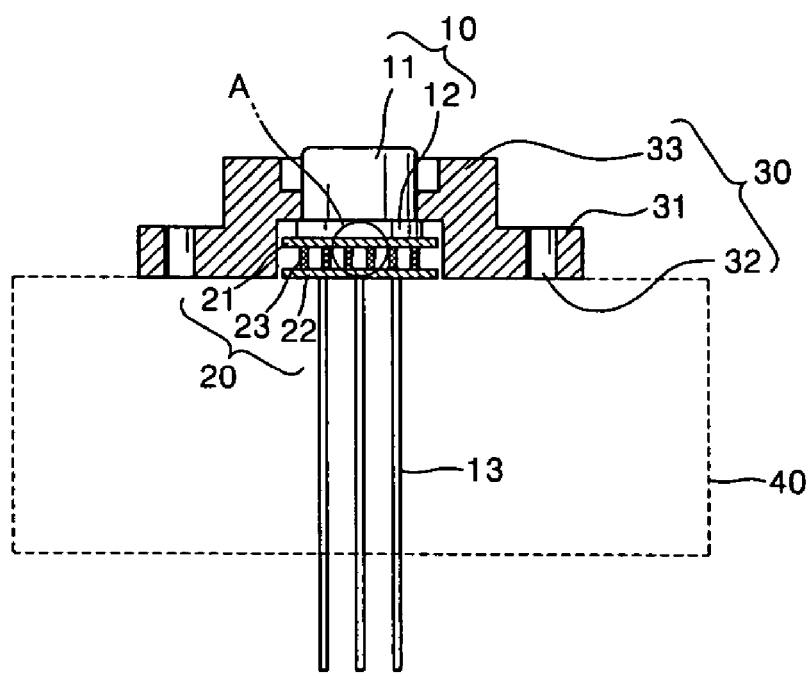
FIG. 2 illustrates a sectional view of the optoelectronic device of FIG. 1.

FIGS. 1 and 2 illustrate a perspective view and a sectional view, respectively, of an optoelectronic device according to an exemplary embodiment of the present invention.

Figure 3:
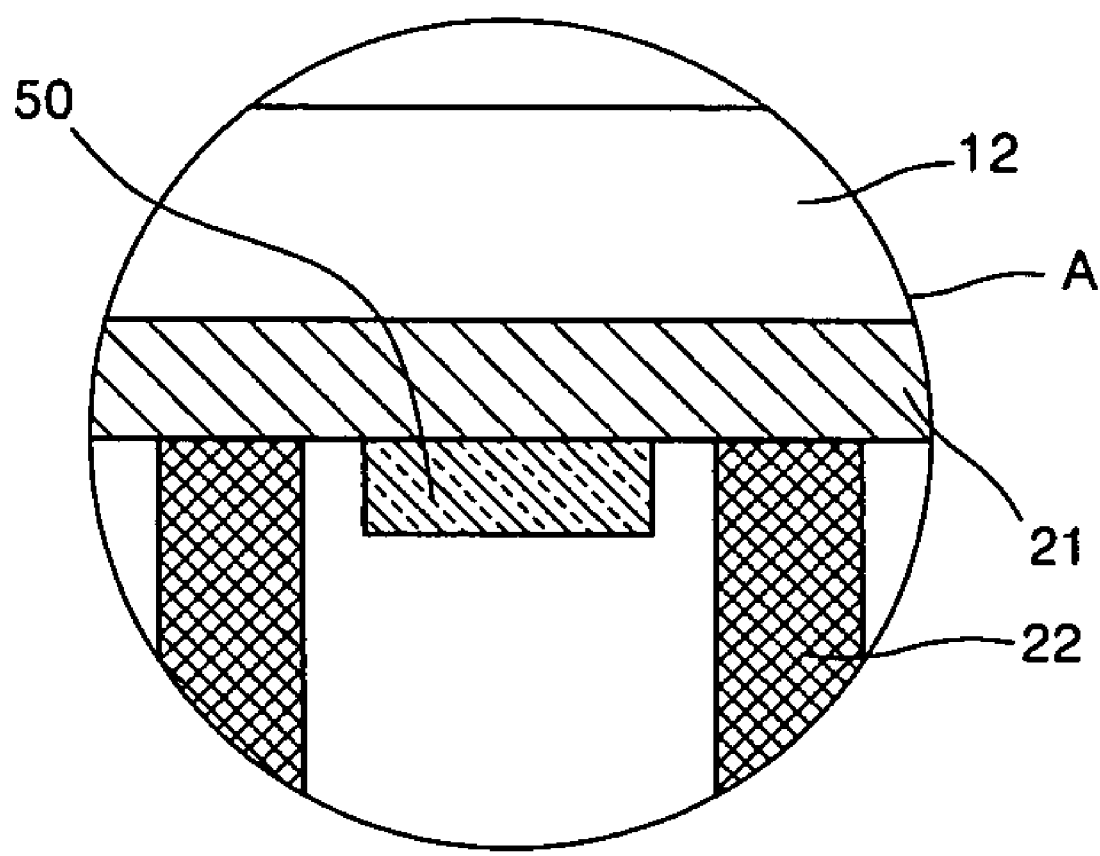
FIG. 3 illustrates a magnified view of portion A of FIG. 2.

Referring to FIGS. 1 through 3, a TO-can optoelectronic transducer 10 is fixed onto an electronic cooling device 20. The TO-can optoelectronic transducer 10 and the electronic cooling device 20 are protected by a bracket 30, which is formed of an adiabatic material.

The optoelectronic transducer 10 includes a head 11, a base 12, and a plurality of leads 13. The head 11 has an active area, the base 12 supports the head 11, and the plurality of leads 13 are electrically connected to the active area included in the head 11 and extend down from the base 12. The active area may either convert electrical power to optical power, i.e., serve as a light source, or convert optical power to electrical power, i.e., serve as a detector.

The electronic cooling device 20 includes a first plate 21, a second plate 22 spaced a predetermined distance from the first plate 21, and a plurality of thermoelectric cooling elements 23, which are arranged between the first and second plates 21 and 22. The first plate 21 is at a heat-absorption side of the electronic cooling device 20, to which the base 12 beneath the head 11 is fixed, and the second plate 22 at a heat-emission side of the electronic cooling device 20.

The bracket 30 protects the optoelectronic device 10 and the electronic cooling device 20 installed beneath the optoelectronic device 10. The bracket 30 includes a body 33, which exposes an upper surface of the head 11, and a flange 31, which is formed on both sides of the body 33 and has a through hole 32, into which a fastener fits to secure the bracket 30 to a fixture.

The bracket 30 is formed of an adiabatic material having a high thermal resistance. As shown in FIG. 2, the bracket 30 may be secured to a heat sink 40 so that heat from the second plate 22 at the heat-emission side of the electronic cooling device 20 can be transmitted to the heat sink 40.

Referring to the detailed illustration in FIG. 3, a temperature sensor 50 may be installed on a bottom surface of the first plate 21. In other words, the temperature sensor 50 is installed on a surface of the first plate 21 other than the surface of the first plate 21 on which the optoelectronic device 10 is installed. Hence, the temperature sensor 50 can precisely sense heat from the base 12 of the optoelectronic device 10 that is absorbed to the first plate 21. Furthermore, since the temperature sensor 50 is placed within the electronic cooling device 20, it responds to the heat delivered to the first plate 21 and is protected from external thermal noise. The temperature detected by the temperature sensor 50 is then fed back to the electronic cooling device 20 to control the temperature of the optoelectronic device 10.

As described above, because the temperature sensor 50 is placed within the electronic cooling device 20, more specifically, beneath the first plate 21, it may easily be electrically connected without requiring separate wiring manufacture. In other words, wiring layers (not shown in FIGS. 1 through 3) for electrically connecting the thermoelectric cooling elements 23 to one another are formed on the bottom surface of the first plate 21 and the upper surface of the second plate 22. While these wiring layers are being formed, wiring layers for the temperature sensor 50 can also be formed. Thus, separate formation of wiring layers or wiring for connecting these wiring layers is not required for electrical connection of the temperature sensor 50.

Figure 4:
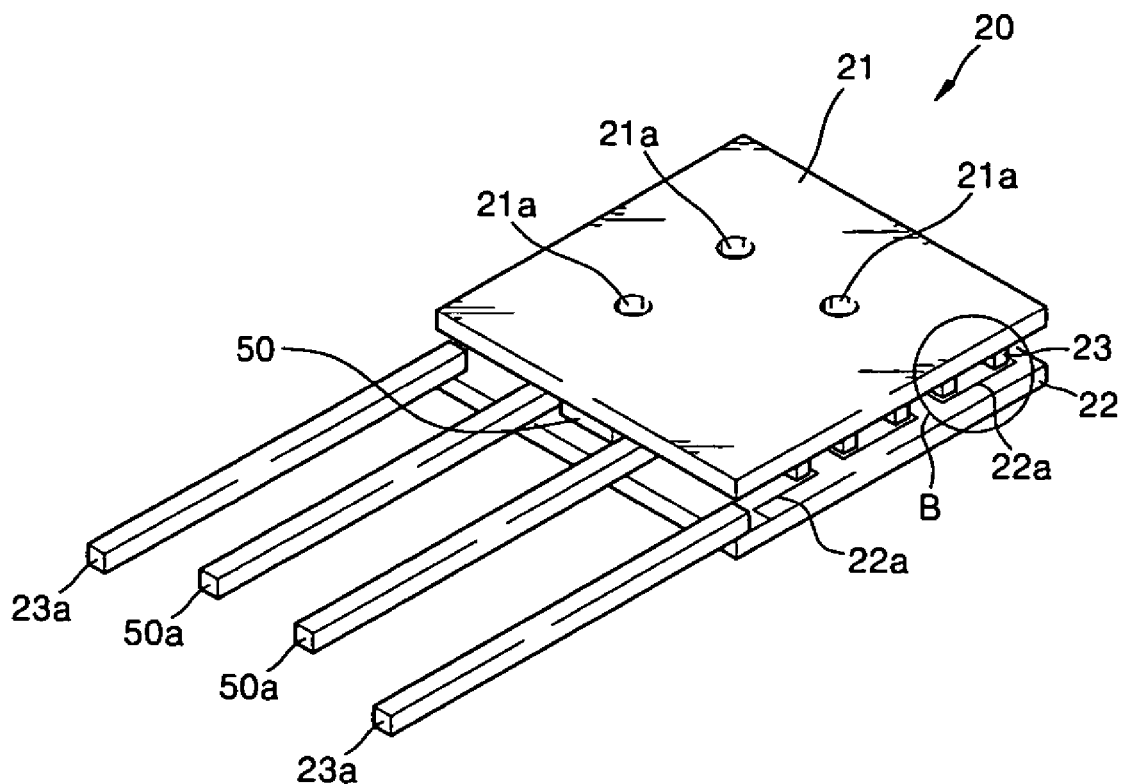
FIG. 4 illustrates a perspective view of an electronic cooling device used in the optoelectronic device of FIG. 1.
Figure 5:
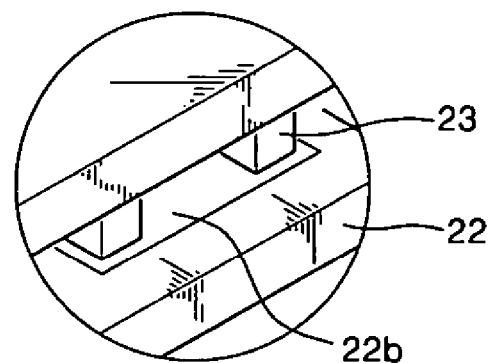
FIG. 5 illustrates a magnified view of portion B of FIG. 4.
Figure 6A:
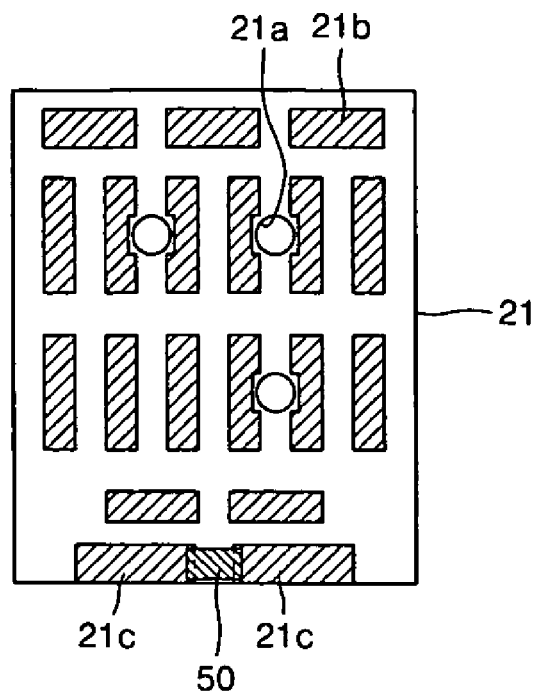
FIGS. 6A and 6B illustrate top views of a bottom surface of a first plate and of an upper surface of a second plate, respectively, of the electronic cooling device of FIG. 4.

FIG. 4 illustrates a perspective view of the electronic cooling device 20 used in the optoelectronic device of FIG. 1. FIG. 5 illustrates a magnified view of portion B of FIG. 4. FIG. 6A illustrates a top view of a bottom surface of the first plate 21, and FIG. 6B illustrates a top view of an upper surface of the second plate 22.

Referring to FIG. 4, the electric cooling device 20 includes a pair of first leads 23a electrically connected to the thermoelectric cooling elements 23 and a pair of second leads 50a electrically connected to the temperature sensor 50. The first plate 21 has a plurality of through holes 21a, through which the leads 13 of the optoelectronic transducer 10 penetrate. As shown in FIG. 6B, through holes 22a are formed in the second plate 22 so that they face the through holes 21a of the first plate 21. The thermo-electric cooling elements 23 are disposed between the first and second plates 21 and 22.

Figure 6B:
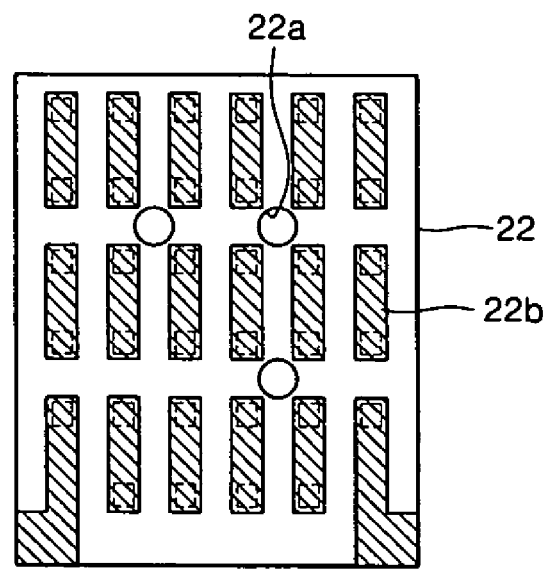

As shown in FIGS. 6A and 6B, wiring layers 21b and 22b for electrically connecting the thermoelectric cooling elements 23 to one another are formed on the bottom surface of the first plate 21 and the upper surface of the second plate 22, respectively. Also, as shown in FIG. 6A, wiring layers 21c, to which the temperature sensor 50 is coupled, are formed on the bottom surface of the first plate 21. The first and second plates 21 and 22 are formed of an electrical insulating material, e.g., alumina ($Al_2O_3$).

In an optoelectronic device according to the present invention as described above, a surface of an electronic cooling device directly contacts a base of a TO-can optoelectronic transducer so that the state of the contact between them is improved. Also, since a temperature sensor for monitoring the temperature of the optoelectronic transducer is directly attached to a substrate of the electronic cooling device, more specifically, to an inside surface of a first plate, the temperature of the optoelectronic transducer can be accurately sensed and adjusted to a precise target temperature.

The optoelectronic device according to the present invention is applicable to various fields and is suitable for non-cooled packages including no built-in temperature sensors. For example, the optoelectronic device may be an optoelectronic signal detector suitable for use in a system which applies light to part of a human body and measures light reflected or transmitted by the human body to invasively or non-invasively measure the concentration of body fluids, e.g., similar to the system discussed above in the related art.

The electrical specification of the electronic cooling device and its related elements, for example, the shapes or materials of the first and second plates and the shapes of wiring layers formed on inside surfaces of the first and second plates, are determined according to the heat capacity of the optoelectronic device and a heat load under a working condition. The electronic cooling device having such a structure has a one-chip type hybrid temperature control circuit only for temperature control, consequently greatly improving the precision and reliability of temperature control.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An optoelectronic device, comprising:
   an optoelectronic transducer having an active area;
   an electronic cooling device, on which the optoelectronic transducer is mounted; and
   a temperature sensor installed in the electronic cooling device, the temperature sensor and the electronic cooling device controlling a temperature of the optoelectronic transducer.

2. The optoelectronic device as claimed in claim 1, wherein the optoelectronic transducer comprises:
   a head having the active area;
   a base, which supports the head; and
   a plurality of leads, which are electrically coupled to the active area and extend from the base.

3. The optoelectronic device as claimed in claim 1, wherein the electronic cooling device comprises:
   a first plate at a heat-absorption side of the electronic cooling device on which the optoelectronic transducer is mounted;
   a second plate at a heat-emission side of the electronic cooling device, the second plate being at a predetermined distance from the first plate; and
   a plurality of thermo-electric cooling elements arranged between the first and second plates.

4. The optoelectronic device as claimed in claim 2, wherein the electronic cooling device comprises:
   a first plate at a heat-absorption side of the electronic cooling device beneath the head;
   a second plate at a heat-emission side of the electronic cooling device, the second plate being at a predetermined distance from the first plate; and
   a plurality of thermo-electric cooling elements arranged between the first and second plates.

5. The optoelectronic device as claimed in claim 3, wherein the temperature sensor is attached to a bottom surface of the first plate.

6. The optoelectronic device as claimed in claim 4, wherein the temperature sensor is attached to a bottom surface of the first plate.

7. The optoelectronic device as claimed in claim 5, further comprising wiring layers for electrically connecting the thermo-electric cooling elements to one another formed on the bottom surface of the first plate.

8. The optoelectronic device as claimed in claim 6, further comprising wiring layers for electrically connecting the thermo-electric cooling elements to one another formed on the bottom surface of the first plate.

9. The optoelectronic device as claimed in claim 7, wherein the temperature sensor is directly connected to the wiring layers.

10. The optoelectronic device as claimed in claim 8, wherein the temperature sensor is directly connected to the wiring layers.

11. The optoelectronic device as claimed in claim 1, wherein the optoelectronic transducer is a TO-can transducer.

12. The optoelectronic device as claimed in claim 1, further comprising a bracket protecting the optoelectronic transducer and the electronic cooling device.

13. The optoelectronic device as claimed in claim 12, wherein the bracket further comprises an opening exposing the active area.

14. The optoelectronic device as claimed in claim 12, wherein the bracket further comprises a body through which the active area is exposed and a flange formed around the body.

15. The optoelectronic device as claimed in claim 14, wherein the flange further comprises at least one through hole for securing the optoelectronic device to a fixture.

16. The optoelectronic device as claimed in claim 15, wherein the fixture is a heat sink.

17. The optoelectronic device as claimed in claim 12, wherein the bracket is made of an adiabatic material.

18. The optoelectronic device as claimed in claim 12, wherein the bracket is made of a material having a high thermal resistance.

19. The optoelectronic device as claimed in claim 1, wherein the optoelectronic transducer is a detector.

20. The optoelectronic device as claimed in claim 1, wherein the optoelectronic transducer comprises leads electrically coupled to the active area and the electronic cooling device comprises holes therein for the leads.

* * * * *